United States Patent [19]  [11] 4,294,871
Hieber et al.  [45] Oct. 13, 1981

[54] METHOD FOR DEPOSITING A LAYER ON THE INSIDE OF CAVITIES OF A WORK PIECE

[75] Inventors: Konrad Hieber; Manfred Stolz, both of Munich, Fed. Rep. of Germany

[73] Assignee: Siemens Aktiengesellschaft, Munich, Fed. Rep. of Germany

[21] Appl. No.: 71,685

[22] Filed: Aug. 29, 1979

Related U.S. Application Data

[63] Continuation of Ser. No. 897,349, Apr. 18, 1978, abandoned.

[30] Foreign Application Priority Data

Apr. 26, 1977 [DE] Fed. Rep. of Germany ....... 2718518

[51] Int. Cl.³ .............................................. C23C 11/00
[52] U.S. Cl. ..................................... 427/237; 118/715; 118/721; 427/248.1
[58] Field of Search ............................. 427/237, 248.1; 118/715, 721

[56] References Cited

U.S. PATENT DOCUMENTS

| 2,671,739 | 3/1954 | Lander | 118/49 |
| 3,291,631 | 12/1966 | Smith | 118/326 |
| 3,338,209 | 8/1967 | Bholg | 118/715 |
| 3,805,736 | 4/1974 | Foehring | 118/49 |

FOREIGN PATENT DOCUMENTS 2312712 10/1973 Fed. Rep. of Germany ...... 427/237

Primary Examiner—Sam Silverberg
Attorney, Agent, or Firm—Kenyon & Kenyon

[57] ABSTRACT

Disclosed herein is a process for the chemical deposition of a material layer on the inside of cavities of a work piece by conducting a gas stream in a substantially laminar flow along a heated work piece wherein deposition occurs from the gaseous phase, at a pressure of less than $10^4$ Pascal (N/m²).

8 Claims, 2 Drawing Figures

METHOD FOR DEPOSITING A LAYER ON THE INSIDE OF CAVITIES OF A WORK PIECE

This is a continuation, of application Ser. No. 897,349 filed Apr. 18, 1978 now abandoned.

BACKGROUND OF THE INVENTION

This invention relates to a method for depositing a layer on the inside of cavities of a work piece and particularly, to the chemical deposition of such a layer from the gaseous phase.

In the construction of chemical apparatus, work pieces are often required which have a very high resistance to corrosive media such as acids. Although glass or plastic meet this criterion, if such work pieces are provided for use at high pressures, such materials can not be employed for such apparatus or for piping systems, and metallic materials such a Hostalloy C or tantalum must be used instead. However, these materials are very expensive and are difficult to work. To reduce the manufacturing costs, thought has been given to the possibility of making such liquid-carrying or gas-carrying piping systems of steel parts which are plated on the inside with a corrosion protection layer, for example, of tantalum. Plating such hollow parts, which often have different inside diameters and, for example, several separately disposed inside canals and openings, can usually be accomplished only by precipitation from the gaseous phase (CVD deposition), since materials such as tantalum, which are suitable for corrosion protection, cannot be electrodeposited. Such CVD deposition methods are known, for example, from U.S. Pat. No. 3,127,641, in which a method for the deposition of tungsten on the inside of a copper tube is described. According to another known method for the inside coating of work pieces, a work piece to be plated is brought into a suitable susceptor, and the deposition is accomplished by means of a CVD method using electric induction heating for heating the work piece. Further information on the chemical gaseous-phase deposition of different materials, such as Ta, W, Mn, Si, Ti, TiC, CrC is given in the journal "Thin Solid Films", 24 (1974), pages 157 to 164.

Inside coating of complicated and difficult-to-manufacture parts, such as, for example, multi-path valves and pump housings which have more than two openings and several internal canals, has not been possible to date with satisfactory results, since the deposited layers exhibited uneven thickness and, in part, also open places. For this reason such parts have been made of solid material, for example, solid tantalum. Such fabrication is very expensive, and, in addition, it must further be taken into consideration that certain work pieces can be made of steel but not, for example, of a material such as tantalum.

SUMMARY OF THE INVENTION

It is an object of this invention to describe a method for depositing a layer on the inside of cavities of a work piece, in which the deposition is accomplished by means of chemical precipitation from the gaseous phase (CVD method), whereby layers can be obtained which have uniform thickness and the corrosion resistance of which is comparable to that of the solid material.

This problem is solved, according to the present invention, by the provision of a method for depositing a material layer on the inside of cavities of a work piece by chemical precipitation from the gaseous phase (CVD deposition) wherein the parts of the work piece to be provided with the layer are heated and a gas stream containing the components of the material to be deposited is conducted along the surface of the work piece parts in a substantially laminar flow pattern, the deposition of the material being conducted at a pressure less than about $10^4$ Pascal (N/m$^2$).

Investigations which were carried out in connection with the invention have shown that in depositing the layering material from the gaseous phase, the prevailing gas pressure is not, as is often assumed, without influence on the deposited layer, but that the quality of the deposited layer can be improved if the deposition process is carried out at a gas pressure which is much lower than atmospheric pressure. The cause thereof can be considered to be that the gas or the gas mixture from which the precipitation takes place should flow past the parts to be coated in as laminar a manner as possible, or that the flow should be adjusted so that turbulence that occurs separates rather than develop as stationary eddies. The result of the development of stationary eddies is that in the volume in question, the reaction gas is depleted of the material to be precipitated and that as a result, the deposition in this area takes place with a smaller layer thickness than at the remaining parts of the work piece. The development of laminar flow, however, is promoted if the precipitation is carried out at a pressure reduced from atmospheric pressure. According to one preferred embodiment of the invention, the flow of the gas or gas mixture used for the deposition can further be influenced favorably by conducting the gas stream along the surfaces to be coated by means of a flow profiler fitted to the shape of the work piece. With appropriate design such a flow profiler causes the gas to flow uniformly past all parts of the work piece to be coated, so that overall, a uniform deposition of the layer is obtained. Since at the recited gas pressure, reduced below atmospheric pressure, the flow cross section of the reaction gas can vary by more than a factor of 10, it is only necessary that such a profiler roughly fit the same shape of the work piece. Thus, work pieces with changes of the inside diameter, for example, from 5 cm to 1 mm can still be coated with a coherent layer. For work pieces with several internal canals, the flow profiler is designed so that the flow resistance for the gas discharge from the individual internal canals is always of approximately the same magnitude. It is thereby achieved that equal quantities of reaction gas mixture are transported through each opening. With appropriate design of profilers it is likewise possible, according to the method of this invention, to also plate the end face of flange connections or the outside of threads.

DETAILED DESCRIPTION OF THE INVENTION

Figure 1:
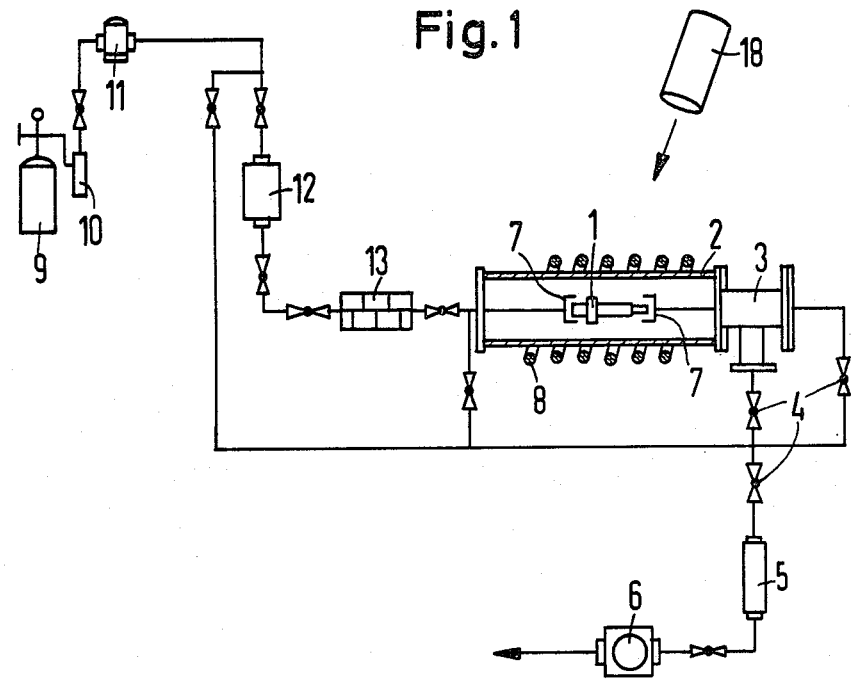
FIG. 1 shows the apparatus used diagrammatically.

As an example of the present invention there is described the coating of a work piece of steel with a tantalum layer. The work piece 1 is located in a quartz vessel 2 that can be evacuated. This quartz vessel is connected to a vacuum pump 6 via a flange system 3 with valves 4 connected thereto and via a cooling trap 5. In the vessel, flow profilers 7 are arranged around the work piece. The vessel 2 is surrounded by an induction coil 8, by which the work piece is heated inductively. At the other end face of the vessel is located the inlet for the reaction gas. The reaction

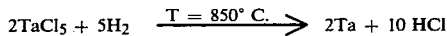

is used for making the tantalum layer. The hydrogen required for the reaction is taken from a pressure bottle 9 and conducted via an oxygen absorber 10, a control valve 11 and a cooling trap 12 to a supply tank 13, which contains TaCl$_5$. This supply tank 13 can be heated, so that the solid tantalum chloride can be kept at a temperature between about 90° and 130° C. At this temperature, the vapor pressure of the tantalum chloride is sufficiently high so that the hydrogen is enriched with a sufficient quantity of gaseous TaCl$_5$. This reaction gas is now conducted to the work piece by way of a heated piping system (T≈150° C.). For the precipitation, the work piece is heated by means of the induction coil 8 to a temperature between about 900° and 1150° C. At the heated points of the work piece, a solid tantalum layer is precipitated in accordance with the reaction

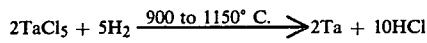

During the precipitation, a pressure of about $3 \times 10^3$ Pa (Pascal,=N/m$^2$) is maintained in the vessel 2 by means of the vacuum pump 6. At a reaction temperature of, for example, 1000° C. for the deposition, the throughput of hydrogen is, for example, 1 liter/min, and the temperature in the supply tank 13 is kept at about 95° to 100° C. The temperature of the work piece can be determined, for example, by means of a pyrometer 18.

Figure 2:
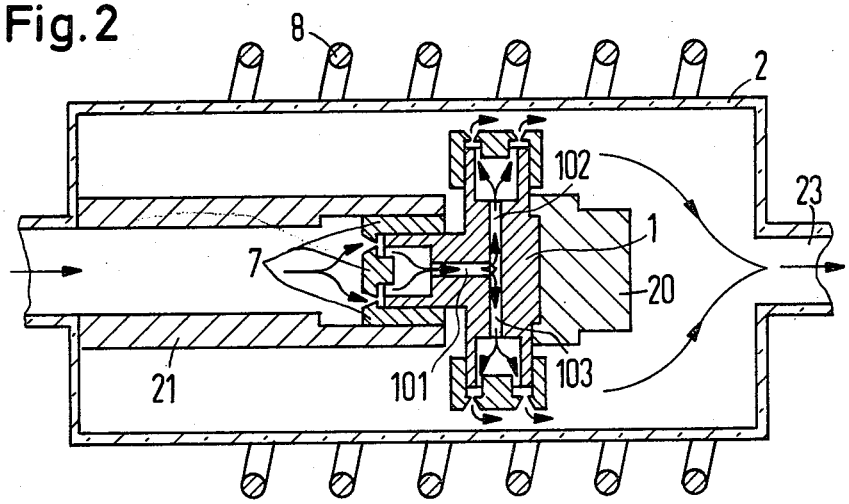
FIG. 2 shows diagrammatically how the reaction gas is conducted past the parts to be coated by means of flow profilers which are arranged at the work piece to be coated.

FIG. 2 shows diagrammatically how a work piece 1, which has several internal canals 101, 102 and 103 with varying inside diameters, is provided with a corrosion-resistant layer, e.g., a tantalum layer. The work piece 1 is fastened in a holder 20. At the outlet openings of the internal canals 101, 102 and 103, flow profilers 7 are pushed on. The gas is fed in by way of tube 21 which surrounds the flow profiler which is arranged at the gas inlet opening of the work piece. The flow profilers 7 cause a uniformly distributed gas flow along the surfaces to be coated of the internal canals 101, 102 and 103 of the work piece. After it has flowed through the work piece, the reaction gas is suctioned off via the flange connection 23.

Besides the deposition of metal, other materials can be deposited by means of the method according to the invention, for example SiO$_2$, through an appropriately developed CVD process, using, for example, the reaction

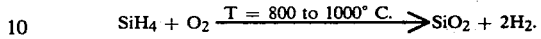

What is claimed is:

1. A method for depositing a layer of material of substantially uniform thickness on the inside of cavities of a workpiece having at least two internal cavities of differing inside diameter by chemical deposition from the gaseous phase, comprising heating the parts of said workpiece to be provided with said layer; conducting a gas stream containing the components of the material to be deposited along the surface of said parts in a substantially laminar flow by provision of a flow profiler at least approximately fitted to the shape of the workpiece and precipitation of said material from the gaseous phase at a pressure of less than $10^4$ N/m$^2$, whereby said flow profiler is designed and fitted to said workpiece so as to cause said gas stream to flow uniformly past the parts of said workpiece and to cause the resistance to flow of said gas stream from each of said individual internal cavities to be of approximately the same magnitude.

2. The method according to claim 1 wherein said work piece on which the material layer is to be deposited is maintained in a vessel which can be evacuated.

3. The method according to claim 1 wherein the heating of the parts of the work piece is by inductive heating.

4. The method according to claim 3 wherein said heating comprises sequentially heating said work piece in individual zones.

5. The method according to claim 1 wherein said layer to be deposited is tantalum, said gaseous stream comprises hydrogen and TaCl$_5$ and the parts of said work piece are heated to a temperature above about 850° C.

6. The method according to claim 5 wherein the parts of said work piece are heated to a temperature in the range of from about 900° to about 1150° C.

7. The method according to claim 6 wherein the pressure at which said deposition is conducted is about $3 \times 10^3$ N/m$^2$.

8. The method according to claim 1 wherein said material to be deposited is silicon dioxide.

* * * * *